United States Patent
Fedigan

(10) Patent No.: US 7,541,946 B2
(45) Date of Patent: Jun. 2, 2009

(54) RELAXATION OSCILLATOR BASED KEYPAD DECODER

(75) Inventor: Stephen J. Fedigan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 617 days.

(21) Appl. No.: 11/386,132

(22) Filed: Mar. 22, 2006

(65) Prior Publication Data

US 2006/0227015 A1 Oct. 12, 2006

Related U.S. Application Data

(62) Division of application No. 10/455,672, filed on Jun. 5, 2003, now Pat. No. 7,064,682.

(51) Int. Cl.
*H03M 11/00* (2006.01)

(52) U.S. Cl. ............... 341/29; 341/22; 341/20; 345/169; 327/115

(58) Field of Classification Search ............ 341/20, 341/22, 29; 345/169; 327/115
See application file for complete search history.

(56) References Cited

U.S. PATENT DOCUMENTS

| 6,184,805 | B1 | 2/2001 | Uggmark |
| 6,222,466 | B1 | 4/2001 | Uggmark |
| 7,064,682 | B2 * | 6/2006 | Fedigan ............ 341/29 |
| 7,196,640 | B2 * | 3/2007 | Fedigan ............ 341/29 |

* cited by examiner

*Primary Examiner*—Albert K Wong
(74) *Attorney, Agent, or Firm*—Robert D. Marshall, Jr; Wade J. Brady, III; Frederick J. Telecky, Jr.

(57) ABSTRACT

The keypad interface element of this invention uses a relaxation oscillator and a digital keypad processor having a counter/timer to decode specific keys. The RC portion of the relaxation oscillator includes a resistance ladder and a set of momentary on pushbutton switches disposed change resistance dependent upon which key is pressed. This causes the relaxation oscillator to produce an output signal having a corresponding frequency. The counter/timer of the digital keypad processor produces a count corresponding to the oscillator frequency. The digital keypad processor latches and holds a binary number specifically identifying the depressed key. A state machine in the digital keypad processor provides transient-free, noise immune keypad decoding.

9 Claims, 3 Drawing Sheets

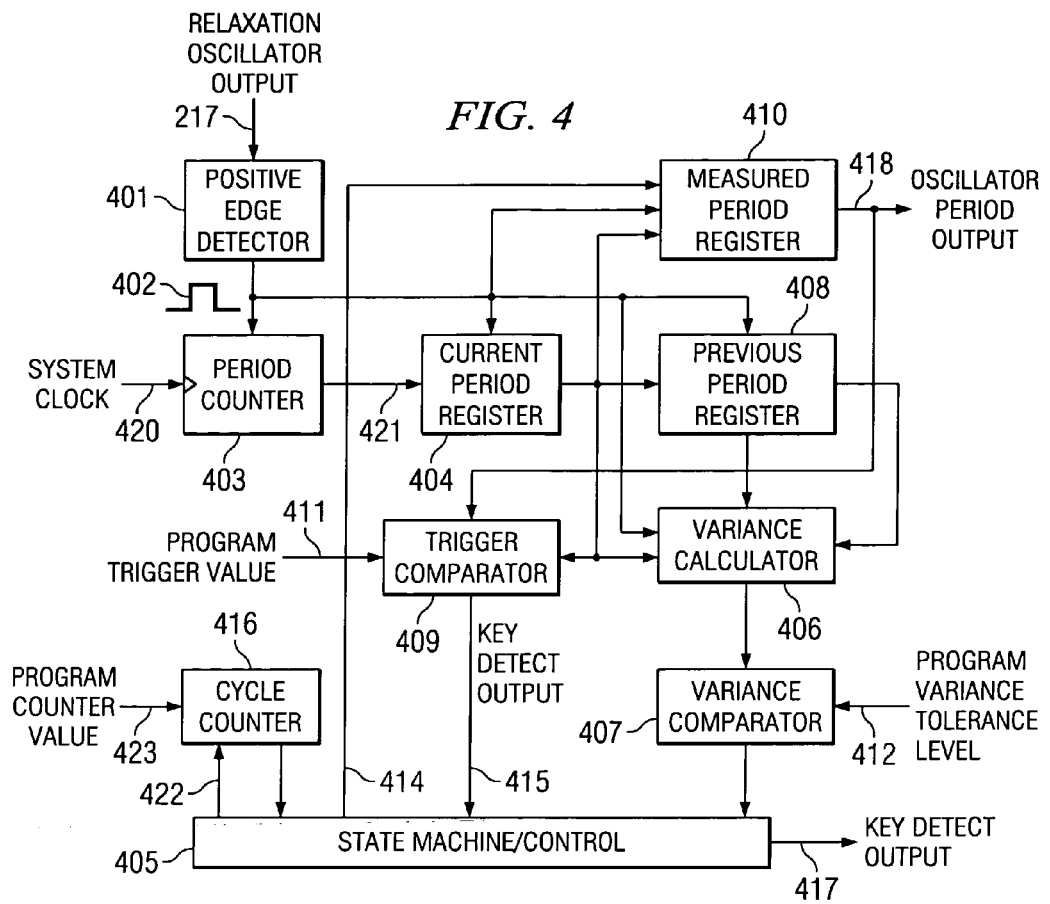
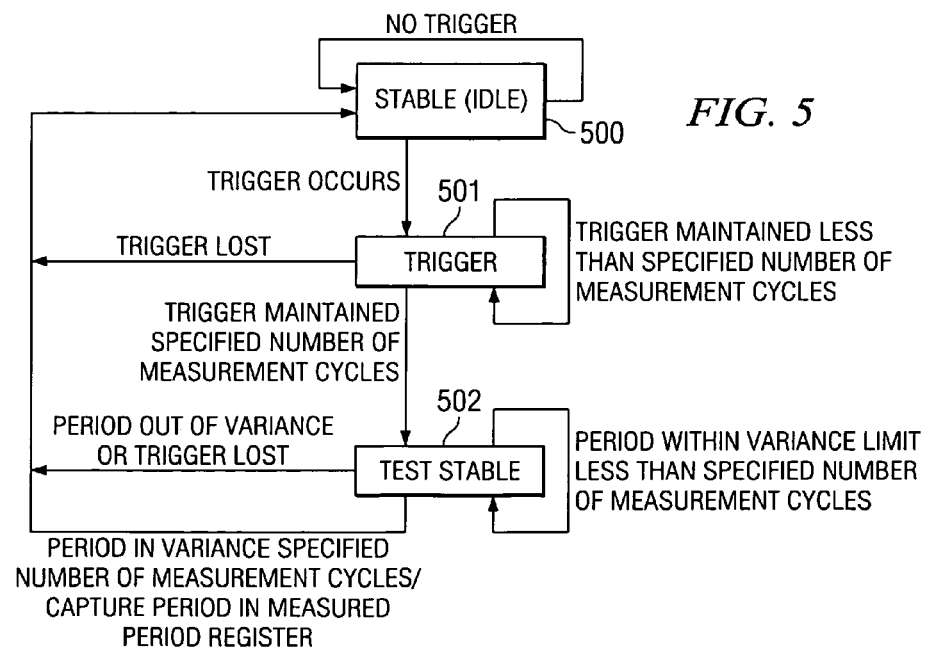

RELAXATION OSCILLATOR BASED KEYPAD DECODER

This application is a divisional of U.S. patent application Ser. No. 10/455,672 filed Jun. 5, 2003 now U.S. Pat. No. 7,064,682.

TECHNICAL FIELD OF THE INVENTION

The technical field of this invention is keypad manual input devices.

BACKGROUND OF THE INVENTION

A common task in the design of consumer devices is that of decoding keypad inputs from the user. Many consumer devices such as audio playback units have a keypad that permits users to navigate through play-lists and select a variety of functions. These keypads must be interfaced to the microprocessor or digital signal processor that controls the consumer device.

Attaching each button to a digital input is not practical. The processors found in small consumer devices typically have a small number of general purpose input pins. Additionally, such pins are normally shared with other processor functions.

A common known solution to this problem employs a binary weighted resistor ladder network and pushbuttons used as an input to an analog-to-digital converter ADC. In this type circuit each button press produces a unique voltage that is converted to a numeric value and sent to the processor.

FIG. 1 illustrates this prior art circuit. Pushbuttons 101 through 108 apply a ground connection to selected nodes in a binary weighted ladder network including weighted resistors 111 through 118 and resistor divider network 119 and 120. For each button pressed generates a binary weighted voltage at node 121. Analog-to-digital converter (ADC) 110 converts the voltage at node 122 to a digital numerical equivalent. Microprocessor 100 decodes the identity of the key depressed.

This approach has numerous disadvantages. Among these are:

1. Needing an analog-to-digital converter;
2. Sensitivity to power line noise; and
3. Decreasing voltage margins as the number of keys increases.

SUMMARY OF THE INVENTION

The keypad decoder of this invention makes use of a relaxation oscillator to detect and identify keystrokes and a simple digital keypad processor. The input portion of the digital keypad processor receives the output waveform from the relaxation oscillator and uses a timer/counter circuit to decode specific keys. A digital output of the timing function generator latches and holds a binary number key code identifying the depressed key. The digital keypad processor detects the specific key encoded and outputs this digital key code information to the host processor. This provides transient-free, noise immune keypad decoding.

BRIEF DESCRIPTION OF THE DRAWINGS

These and other aspects of this invention are illustrated in the drawings, in which:

FIG. 4 illustrates a block diagram of the digital keypad processor of FIG. 2;

FIG. 5 illustrates a state machine diagram describing the states of the state machine illustrated in FIG. 4;

DETAILED DESCRIPTION OF PREFERRED EMBODIMENTS

Figure 1:
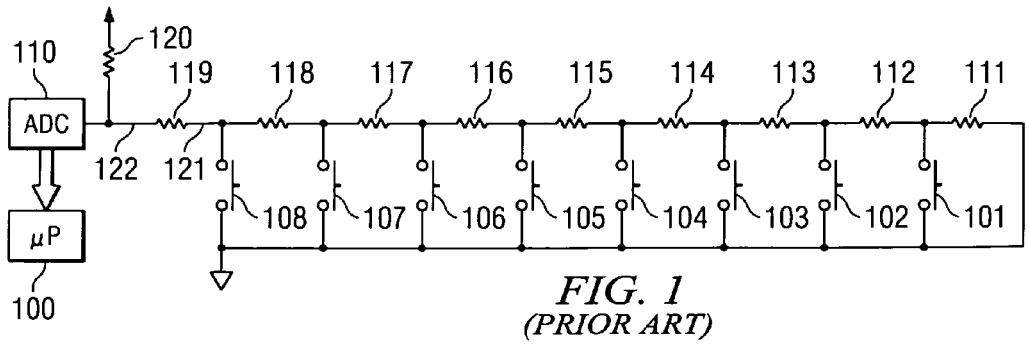
FIG. 1 illustrates a conventional keypad decoder circuit including a resistor ladder network, pushbutton switches and an analog-to-digital converter (Prior Art)
Figure 2:
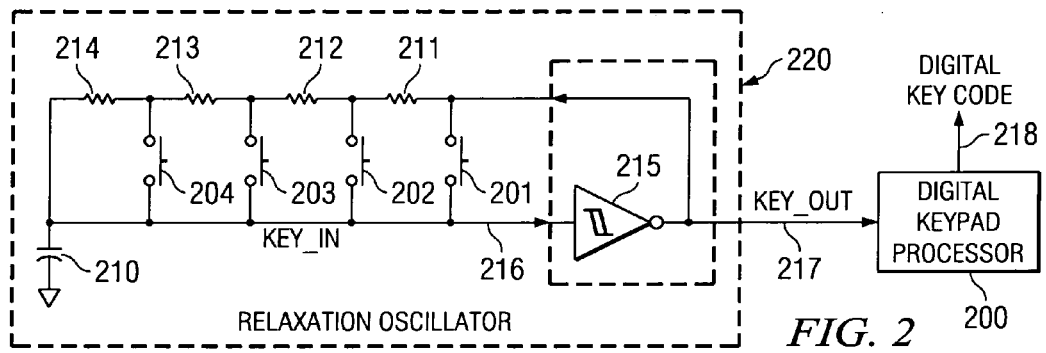
FIG. 2 illustrates a first embodiment of the keypad decoder of this invention including a relaxation oscillator circuit formed by a weighted resistor network and pushbuttons connected to a CMOS inverter and a simple digital keypad processor.

FIG. 2 illustrates a first embodiment of the keypad decoder of this invention including relaxation oscillator 220 and digital keypad processor 200. Relaxation oscillator 220 converts pushbutton inputs into a square wave output whose frequency varies depending on the button or buttons pressed. Digital keypad processor 200 measures and records the period of the relaxation oscillator waveform and sends the measured period output to a host processor as digital key code 218. This measured period output is mapped by software into a respective key-code.

Relaxation Oscillator

Relaxation oscillator 220 generates a square wave variable frequency waveform. CMOS inverter circuit 215, the active element of relaxation oscillator 220, has a double-valued input threshold voltage that is dependent upon the direction of input voltage variations. The resulting transfer characteristic is commonly referred to as one having hysteresis. FIG. 2 illustrates a first embodiment of a plurality of possible relaxation oscillator circuit configurations. Element 215 of FIG. 2 illustrates the symbol for the CMOS inverter with hysteresis. Relaxation oscillator 220 operates in an astable mode oscillating between two states whether any or no key 201, 202, 203 and 204 is pressed.

The first of the two astable states of the relaxation oscillator occurs when capacitor 210 is fully charged and supplies a 'high' input voltage at node 216 to inverter 215. This causes the inverter output 217 to go 'low' and current will flow along the path from node 216 to node 217 through resistors 211, 212, 213 and 214, discharging the capacitor 210. As the capacitor 210 discharges the voltage 216 decays to below the input threshold voltage of inverter 215.

At this point the second astable state is reached and the inverter output voltage at node 217 switches from a 'low' to a 'high.' The current through the series resistors 211, 212, 213 and 214 reverses direction and now flows from node 217 to node 216 causing the capacitor 210 to charge in a positive-going direction. This current flows until capacitor 210 reaches its fully charged state and the circuit returns to the first astable state. Whichever key 201, 202, 203 or 204 is depressed or if none are depressed, relaxation oscillator 220 produces a unique and predictable square wave output frequency.

Figure 3:
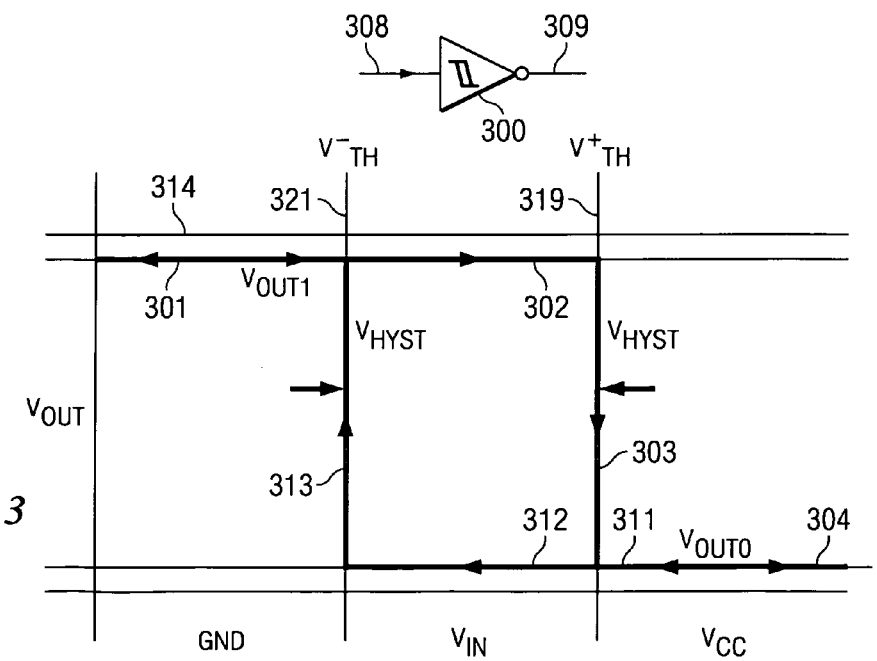
FIG. 3 illustrates the circuit symbol of the CMOS inverter used in the relaxation oscillator circuit of FIG. 2 and its characteristic hysteresis transfer function.

To improve transient noise immunity caused by keystroke 'bounce' effects, inverter 215 has a transfer function with hysteresis properties. FIG. 3 illustrates this transfer function. As the input voltage 308 to the inverter 300 rises from zero volts in a positive-going direction, the output voltage 309 starts along path 301 and 302 at $V_{OUT1}$ until input voltage 308 reaches threshold voltage $V_{TH}^+$ 319 for positive-going input. Then output voltage 309 makes a transition 303 to $V_{OUT0}$ and continues along path 304 for higher values of input voltage 308.

As the input voltage 308 to the inverter 300 falls from a value higher than $V_{TH}^+$ 319 in a negative-going direction, output voltage 309 starts along path 311 and 312 at $V_{OUT0}$ until input voltage 308 reaches threshold voltage $V_{TH}^-$ 321 for negative-going input. Then output voltage 309 makes the transition 313 to $V_{OUT1}$ and continues along path 314 for lower values of input voltage 308. There are several known robust circuit configurations conventionally used in the implementation of this kind of inverter circuit. The hysteresis property and not the details of the circuit design is importance here.

When using inverter 300 in a relaxation oscillator, the output voltage makes excursions limited to the cyclic path 302-303-312-313-302. Output voltage 309 switches from $V_{OUT0}$ to $V_{OUT1}$ and back to $V_{OUT0}$ repeating for each oscillator cycle. Likewise input voltage 308 switches only between the input limits $V_{TH}^+$ and $V_{TH}^-$. The period of the relaxation oscillator square wave corresponds to the resistor and capacitor component values by the formula:

$$T = K R_{eq} C \quad [1]$$

where: K is a constant relating to the hysteresis properties of inverter 215; $R_{eq}$ is the equivalent resistance; and C is the value of timing capacitor 210. The exact topology of the resistor network employed in this invention depends on whether single or multiple key-press detection is required.

Relaxation oscillator 220 includes a prescribed network set of series switches, resistors and a timing capacitor collectively placed between the KEY_IN device pin 216 and KEY_OUT device pin 217. Using other possible resistor-pushbutton connections any one of a number of possible configurations may be used to customize the device for useful keypad encoding characteristics.

Some of the desirable properties of this circuit are:

1. Decoding single keystrokes with high immunity to transient noise and pushbutton 'bounce';

2. Non-recognition of unintentional weak contact to keys; and

3. Successful encoding of valid and invalid double keystrokes (two keys at once).

The exact topology of the resistor network depends on whether single or multiple key-press detection is required. For single key-presses, the ladder network shown in FIG. 2 generates uniformly spaced periods and can be easily constructed. The relationship between the key pressed and the resulting relaxation oscillator period is summarized in Table 1 below.

TABLE 1

| Pushbutton # | Period |
|---|---|
| 1 | T |
| 2 | 2T |
| 3 | 3T |
| 4 | 4T |
| None | 5T |

While FIG. 2 illustrates an example of an elementary circuit with four only pushbuttons, this circuit can be extended to an arbitrary number, providing that the resistors have sufficiently controlled tolerance. For example, calculations show that up to nine pushbuttons can be reliably decoded with 5% resistors, and up to forty-nine pushbuttons can be decoded with 1% resistors.

Keypad Decoder

FIG. 4 illustrates a block diagram of digital keypad processor 200 of FIG. 2 used to decode key-presses. Positive edge detector 401 receives oscillator output 217 and generates a pulse 402 for each rising edge. The first edge received resets the period counter 403, having typically 10 or more bits of resolution. Period counter 403 increments at a clock frequency determined by either the system clock 420 or a submultiple of the system clock frequency derived from a frequency divider block external to FIG. 4. The arrival of the next pulse 402 causes the last-occurring period measurement to be transferred from current period register 404 to previous period register 408 and period counter 403 output 421 to be captured in current period register 404.

Trigger comparator 409 computes the absolute difference between the value in current period register 404 and value in measured period register 410. If the difference is sufficiently large, trigger comparator 409 sets trigger flag 415. Variance calculator 406 continuously calculates the oscillator period variation based on the values in current period register 404 and previous period register 408 and previous variance calculations based on two special computation equations. The first equation employs a high pass digital filter to extracts the time-varying component of the period data. The second equation estimates the level of the varying signal by low pass filtering the absolute value of data from the first filter.

The output from variance calculator 406 is sent to variance comparator 407, which sets a flag if the variance output exceeds a programmed threshold. State machine controller 405 uses cycle counter 416 to count either the number of measurement cycles trigger comparator 409 reports a trigger condition or variance comparator 407 reports a within-variance condition. Finally, measured period register 410 holds the period of the last recorded key press and provides this value at output 418, the oscillator period output.

FIG. 5 illustrates a flow diagram of state machine controller 405. In stable state 500 the oscillator period has been within a preset tolerance band of measured period register 410 for one or more measurement cycles. In trigger state 501 the trigger flag 415 has been set less than a specified number of measurement cycles. In test stable state 502 the trigger condition has persisted for a minimum specified number of consecutive cycles and the period variance has been within the established limit less than a specified number of consecutive cycles.

In a typical key press or release sequence, processing begins in the stable state 500. Initially, the oscillator is running at a constant frequency. When a key is depressed or released, the frequency of the oscillator changes. These changes are registered as differences between current period register 404 and the last key press period recorded in measured period register 410.

This condition is reported by trigger comparator 409 to state machine controller 405. State machine controller 405 then transitions from stable state 500 to trigger state 501. If the trigger condition persists for the specified number of measurement cycles in cycle counter 416, state machine controller 405 transitions to test stable state 502. However, if the trigger condition is not maintained for the specified number of measurement cycles, state machine controller 405 returns to stable state 500 without recording the key press in measured period register 410.

Once in test stable state 502, the oscillation period variance is compared to a threshold in variance comparator 405. If the period variance is below the threshold for a prescribed number of measurement cycles, the final period measurement is captured and stored in measured period register 410, key detect output flag 417 is set to indicate the arrival of new key press data and state machine controller 405 returns to stable state 500. However, if the period variance rises above the threshold in test stable state 502 or the trigger is lost, state machine controller 405 returns to stable state 500 without registering a key press.

If a noise burst causes spurious period measurements, the response of state machine controller 405 depends on the magnitude and the duration of the noise. If the noise magnitude does not produce a trigger condition, state machine controller 405 will remain in stable state 500. However, if the noise is sufficient to produce a trigger, state machine controller 405 will transition from stable state 500 to trigger state 501. If the trigger does not persist the prescribed number of measurement cycles set by cycle counter 416, state machine controller 405 will return to the stable state 500 and the noise event will be completely ignored.

However, if the noise has sufficient magnitude and duration, state machine controller 405 will transition from trigger state 501 to test stable state 502. However, in most cases, if state machine controller 405 enters test stable state 502, the period variance will be above the threshold, and state machine controller 405 will transition back to stable state 500 without accidentally recording the noise as a measurement in measured period register 410.

In addition to providing noise immunity, state machine controller 405 prevents a contact bounce from being interpreted as multiple key presses. In this event, the initial bounce will cause state machine controller 405 to transition from stable state 500 to trigger state 501. In most cases, the bounce will not produce a trigger condition for the prescribed number of cycles and state machine controller 405 will return to the stable state 500. If multiple bounces occur, state machine controller 405 may cycle several times between stable state 500 and trigger state 501. When the bounce stops and the measured period stabilizes, state machine controller 405 will cycle through states 500, 501, 502, and 500.

Advantages of the Invention

The present invention has the following advantages over prior art:
1. The AD converter is replaced by a simple oscillator and a counter circuit;
2. The circuit is considerable less sensitive to voltage noise;
3. A large number of pushbutton inputs can be decoded;
4. The only external components required are a single capacitor and only one resistor/pushbutton for each key press detection; and
5. By selecting appropriate resistor values, it is possible to detect multiple key-presses.

Figure 6:
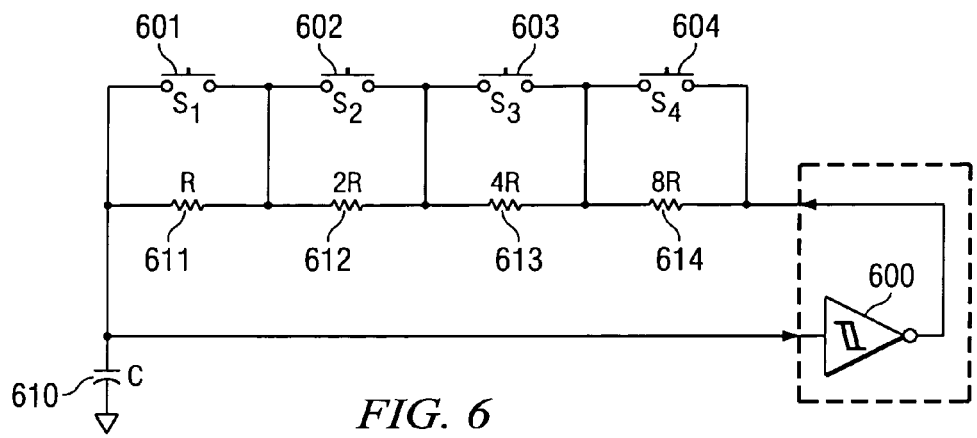
FIG. 6 illustrates a second embodiment of the resistor/keypad network configuration of this invention.

FIG. 6 illustrates a second embodiment of the invention capable of detecting multiple key-pressed. Resistors 611, 612, 613 and 614 are assigned values increasing in powers of two instead of the uniform values of the first embodiment of FIG. 2. These resistors are placed in parallel with the pushbuttons 601, 602, 603 and 604. The relaxation oscillator of FIG. 6 also includes capacitor 610 and hysteresis inverter 600. Any one or more key presses of pushbuttons 601, 602, 603 and 604 produces a unique resistance and hence a unique relaxation oscillator frequency.

In FIG. 6 the space defined by fractions of relaxation oscillator period rapidly fills up. Thus only a small number of pushbuttons can be supported. If resistors with 1% tolerance are used, the inventors estimate that a decoder can discriminate any combination of five pushbuttons. Likewise, a keypad with eight pushbuttons can be supported with 0.1% resistors. Fortunately, in most cases, all key-press combinations do not need to be detected. In such cases a combination of topologies illustrated in FIGS. 2 and 6 can be used.

Figure 7:
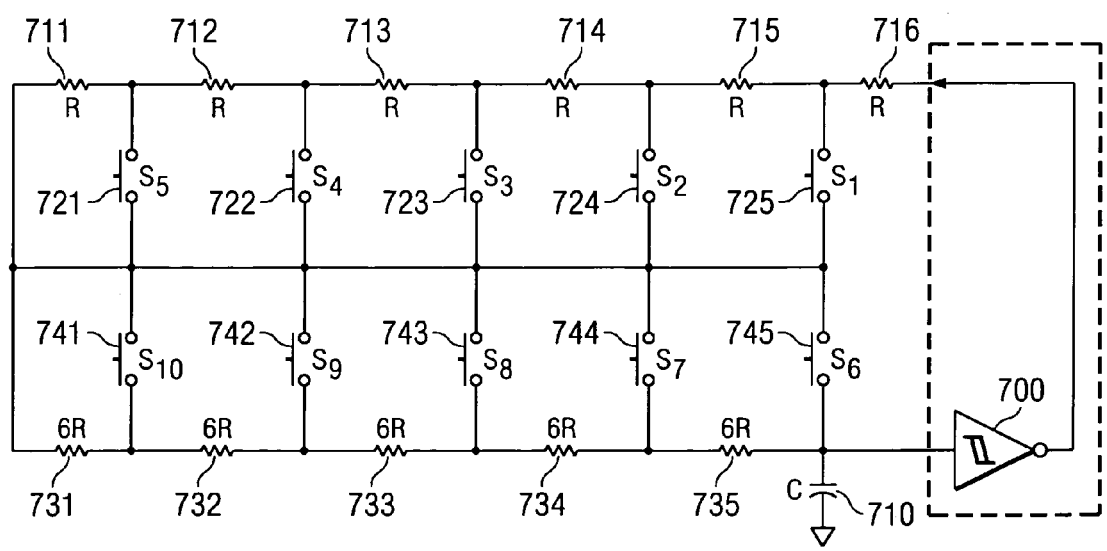
FIG. 7 illustrates a third embodiment of the resistor/keypad network configuration of this invention.

FIG. 7 illustrates a third embodiment of the invention. The pushbuttons are organized into two banks of five pushbuttons. The relaxation oscillator of FIG. 7 also includes capacitor 710 and hysteresis inverter 700. All single key-presses can be detected as well as any input combination where one pushbutton from bank A including pushbuttons 721, 722, 723, 724 and 725 and another from bank B including pushbuttons 741, 742, 743, 744 and 745 is depressed. The resistors of bank A all have the value R. The resistors of bank B all have the value 6R, which is the sum of all resistors of bank A. Note that equal number of pushbuttons in bank A and bank B is not required. FIG. 7 merely illustrates an example where there are five pushbuttons in bank A and 5 pushbuttons in bank B. Table 2 summarizes the relationship between the pushbutton input and the resulting period for the circuit of FIG. 7.

TABLE 2

| Combinations | S1 | S2 | S3 | S4 | S5 | Open |
|---|---|---|---|---|---|---|
| S6 | 1T | 2T | 3T | 4T | 5T | 6T |
| S7 | 7T | 8T | 9T | 10T | 11T | 12T |
| S8 | 13T | 14T | 15T | 16T | 17T | 18T |
| S9 | 19T | 20T | 21T | 22T | 23T | 24T |
| S10 | 25T | 26T | 27T | 28T | 29T | 30T |
| Open | 31T | 32T | 33T | 34T | 35T | 36T |

What is claimed is:

1. A method of keypad decoding employing a relaxation oscillator with a resistor/capacitor time constant comprising the steps of:
    disposing a resistor ladder series connection of resistance elements each having twice the resistance of an immediately prior element,
    disposing pushbutton key switches relative to the resistor to change a resistance value of the resistor to unique resistance on a key press including disposing pushbutton key switches across each resistance elements whereby any key press of any combination of pushbutton keys produces a corresponding unique resistance;
    detecting an oscillation frequency of the relaxation oscillator; and
    determining a key pressed from the oscillation frequency including determining which one or more pushbutton key are pressed.

2. The method of claim 1 wherein:
    said step of detecting the oscillation frequency includes counting clock pulses between consecutive cycles of the relaxation oscillator.

3. The method of claim 2 wherein:
    said step of detecting the oscillation frequency further includes
        detecting when a current count differs from a prior count for more than a predetermined number of oscillation frequency count cycles,
        if the current count differs from the prior count for more than the predetermined number of oscillation frequency count cycles, then detecting when a variance in the current count is less than a predetermined variance threshold for more than a predetermined number of oscillation frequency count cycles, and if the variance in the current count is less than the predetermined variance threshold for more than the predetermined number of oscillation frequency count cycles, then setting the prior count to the current count.

4. A data entry apparatus comprising:

a relaxation oscillator including an inverter having input and output, a capacitor connected between the input of said inverter input and ground, a resistor ladder connected between said input and said output of said inverter including a series connection of plural resistance elements each having twice the resistance of an immediately prior element, and a set of momentary on pushbutton key switches connected to said resistor ladder disposed to change a resistance of said resistor ladder upon activation of a pushbutton key switch, said set of momentary on pushbutton switches are disposed across respective resistance elements whereby any key press of any combination of pushbutton keys produces a corresponding unique resistance; and a digital keypad processor coupled to said relaxation oscillator generating a digital key code corresponding to one or more pushbutton key switches pressed based upon relaxation oscillator frequency.

5. The apparatus of claim 4 wherein:

said digital keypad processor includes a counter receiving clock pulses for counting between consecutive cycles of said relaxation oscillator.

6. The apparatus of claim 5 wherein:

said digital keypad processor further includes an edge detector triggering said counter on a predetermined edge of relaxation oscillator output.

7. The apparatus of claim 5 wherein:

said digital keypad processor further includes a current period register storing a last count, a measured period register storing last determined relaxation oscillator count, a comparator triggered when said last count differs from said last determined relaxation oscillator count, and a state machine triggered by said comparator changing said last determined relaxation oscillator count to said last count if last count differs from said last determined relaxation oscillator count for longer than a predetermined period of time.

8. The apparatus of claim 7 wherein:

said digital keypad processor further includes a cycle count register storing a programmable value of said predetermined period of time.

9. The apparatus of claim 7 wherein:

said digital keypad processor further including a previous period register storing an immediately prior count, and a variance calculator connected to said current period register and said previous period register triggering when a difference between last count and said immediately prior count exceeds a predetermined amount; and said state machine connected to said variance calculator inhibiting changing said measured period to said last count if said variance calculator is triggered.

* * * * *